Figure 1:
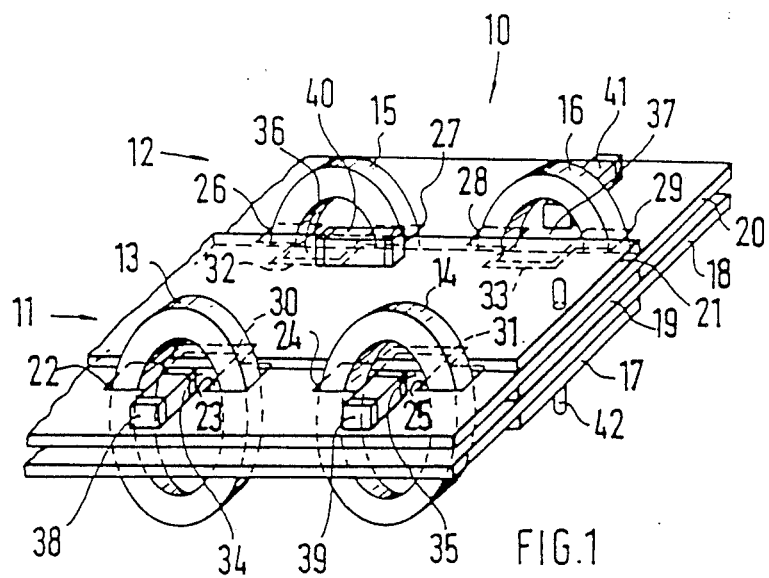

United States Patent [19]
Pfizenmaier et al.

[11] Patent Number: 4,956,627
[45] Date of Patent: Sep. 11, 1990

[54] HIGH-FREQUENCY COMPONENT

[75] Inventors: Heinz Pfizenmaier, Leonberg; Ewald Schmidt, Ludwigsburg, both of Fed. Rep. of Germany

[73] Assignee: Robert Bosch GmbH, Stuttgart, Fed. Rep. of Germany

[21] Appl. No.: 420,493

[22] PCT Filed: Feb. 18, 1988

[86] PCT No.: PCT/DE88/00085
§ 371 Date: Jul. 19, 1989
§ 102(e) Date: Jul. 19, 1989

[87] PCT Pub. No.: WO88/07257
PCT Pub. Date: Sep. 22, 1988

[30] Foreign Application Priority Data
Mar. 13, 1987 [DE] Fed. Rep. of Germany ....... 3708209

[51] Int. Cl.$^5$ ................... H01F 15/02; H01F 27/30
[52] U.S. Cl. ........................... 336/65; 336/200; 336/232
[58] Field of Search ............ 336/65, 200, 221, 232, 336/215, 214

[56] References Cited
U.S. PATENT DOCUMENTS
4,253,231  3/1981  Nouet ................... 336/200

FOREIGN PATENT DOCUMENTS
0126169  11/1984  European Pat. Off. ......... 336/200
2054457  5/1972  Fed. Rep. of Germany ...... 336/200
WO85/00072  1/1985  PCT Int'l Appl. ........... 336/200
WO86/00749  1/1986  PCT Int'l Appl. ........... 336/200

Primary Examiner—Thomas J. Kozma
Attorney, Agent, or Firm—Michael J. Striker

[57] ABSTRACT

A high-frequency transformer is proposed in which at least one elastic carrier (18, 20) is constructed with openings (22 to 29, 52, 69, 73, 74) and also with cutouts (30 to 33, 53, 70, 71, 75, 76, 77) in such a way that the regions on the carrier (18, 20) delimited by the cutouts form a tongue (72, 78), which may be lifted to insert a magnetic core (13 to 16). Around the cores (13 to 16) in the openings (22 to 29, 52, 69, 73, 74) conductor tracks (51, 57, 58, 80, 81, 92) are mounted on one or both sides of the carrier (18, 20), and are completed as a turn or as a continuous winding by conductor track parts (64, 66, 67) mounted on bridges (17, 19, 21). At definite locations, the conductor tracks (51, 57, 58, 80, 81) have bonding pads (85, 89, 91) for surface mounted devices (38 to 41, 86, 87). In common with the insulation spacings between the conductor tracks, the conductor track widths are adjusted to the dimensions of the surface mounted devices (86, 87). Because of the construction of alternating layers of carriers (18, 20) and bridges (17, 19, 21) it is possible to realize a pre-set number of coil turns. Consequently, with the high-frequency transformer it is possible to realize all electronic circuits, especially such as have high-quality repeating coils, up to a high operating frequency and with a high packaging density of the components.

10 Claims, 2 Drawing Sheets

HIGH-FREQUENCY COMPONENT

PRIOR ART

The invention proceeds from a high-frequency transformer having at least one annular core supported on elastic carrier sheets. There is known from the German Patent Application P 28 58 369.9 a flat coil, in which the sum of the insulation spacings between the turns and the widths of the conductor tracks is adjusted to the dimensions of the components to be connected in parallel or in series to the coil. The insulation spacing between the turns increases from the inside outwards at least in partial areas, so that the parasitic winding capacitances are reduced. The advantage provided by this measure is that the limiting frequency of the coil is increased. With the known flat coil, there is a limit to the maximum coil inductance which can be achieved at high frequency.

There is known from the German Offenlegungsschrift 3,322,004 an inductive component which has a coil mounted on an insulating carrier in the form of printed conductor tracks, and a closed ferrite core. Accordingly, it is possible to realize repeating coils with this arrangement. The insulating carrier consists of an elastic material, which springs back into its position in the plane after being deformed. Provided in the insulating carrier are openings for accepting the ferrite core, and inserting slots for the core, which end in these openings. Together with the section bounded by two neighbouring supports, the strip passing through the ferrite core forms an elastic tongue, which can be removed from the plane of the insulating carrier in order to introduce the core into the openings, and springs back into position in the plane after being released under the effect of its intrinsic elasticity, the tongue strip centring and retaining the ferrite core in the openings. With this inductive component, too, there is a limit to the inductance magnitude at high frequency. Certainly, it is possible in principle to increase the inductance by raising the number of turns, but then it is necessary to put up with an undesirable increase in the leakage inductance, because with a rise in the number of turns there is likewise an increase in the distance from the core of the conductor tracks arranged in a plane.

Advantages of the Invention

The high-frequency transformer according to the invention has the advantage that for the same requirement in areas as before it is possible at high frequency to realize coils of high quality having almost arbitrary inductance magnitudes. Conductor tracks are arranged on at least two flexible, mutually insulated carriers lying one above another. In common with the carriers, the electrical conductors are approximately cut open, and reconnected by means of one or more intervening bridges, which have corresponding conducting track parts, so that closed turns are produced. The conducting pieces arranged on the additional insulating carriers are bonded to the conductor tracks arranged on the carriers with a soldering joint or by means of thermocompression as for multilayer circuits. In the course of the conductor tracks, or at the conductor track ends, bonding pads for surface mounted devices are constructed on the underside of the undermost carrier, or on the undermost bridge and/or on the upperside of the uppermost carrier, or on the uppermost bridge.

It is an advantage that after being inserted into the openings in the carrier the magnetic core employed is captively connected to the latter, there being no need for special, additional measures and preparations to secure the location of the core in the openings. Accordingly, it is excluded that the cores can fall out during transport from the assembly station to a further station, for example a soldering station.

In a form of the high-frequency component according to the invention the sum of the insulation spacings between the turns and the widths of the conductor tracks is adjusted to the dimensions of the SMDs. With this form of coil it is possible to employ predetermined, easily obtainable SMDs, and to adjust the form of the coils thereto. Consequently, there is no need for SMDs with special dimensions.

The high-frequency component according to the invention is not restricted to being realized by only one wired-up coil or one repeating coil. It is possible without any difficulty to realize on a carrier sheet more than one wired-up coil having surface mounted devices. In this way, complete active and passive high-frequency circuits with outstanding electrical characteristics can be realized at favourable cost. In particular, a high operating frequency of the circuits and a high packaging density of the components are achieved.

In a particular embodiment of the high-frequency component according to the invention more than one coils are arranged in two rows next to one another, the removable tongues of the one row of coils and of the other row of coils being provided in the area between the two rows, so that only one narrow bridge is required per layer for all coils. The sandwich construction and the centring of individual layers one to another is thereby greatly simplified, because each working step simultaneously encompasses all coils.

It is possible to realize all conceivable electronic circuits with active and passive surface mounted devices (SMD) with the high-frequency component according to the invention. Of particular interest is the realization of the repeating coil having the ratio of a number of turns of 1:1, as is required for all-pass filters. Mutual crossover of the primary and secondary produces a symmetrical repeating coil circuit having identical winding capacitances and a low leakage inductance, therefore making it possible to realize in this way repeating coils that are almost ideal for all-pass filter sections. With all-pass filter sections the winding capacitances of primary to secondary can be assigned to a capacitor to be connected to the repeating coil. In this way, the real all-pass filter section has only the unavoidable ohmic losses, and hence the desired minimum transmission loss and the previously calculated group delay as a function of the frequency.

Further details and developments of the high-frequency component according to the invention ensue from further sub-claims in conjunction with the following description.

DRAWING

Figure 3:
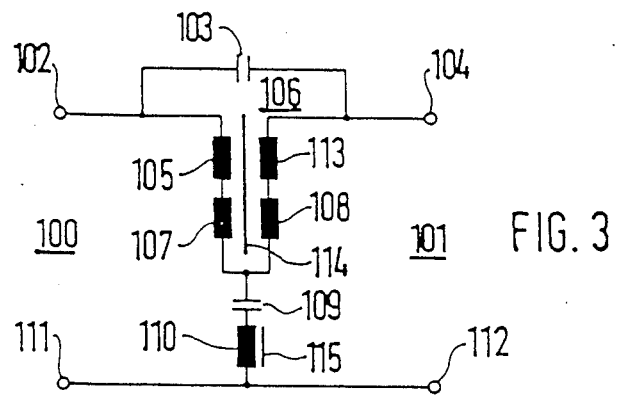
Figure 2:
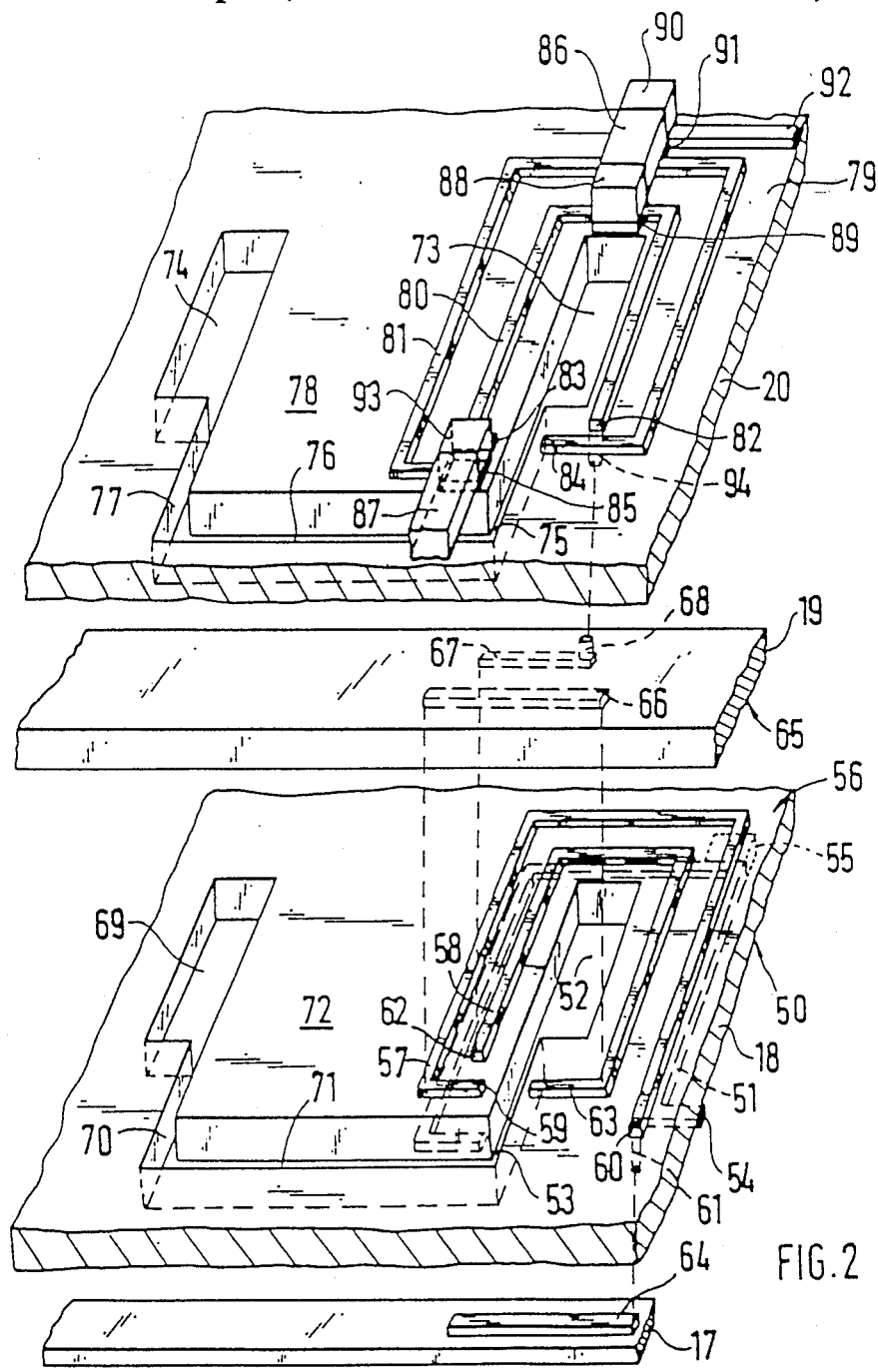

FIG. 1 shows a perspective representation of a high-frequency transformer according to the invention, FIG. 2 shows the construction of a part of the high-frequency transformer according to FIG. 1 in detail, and FIG. 3 shows a circuit diagram of a wired-up repeating coil.

DESCRIPTION OF THE ILLUSTRATIVE EMBODIMENTS

FIG. 1 shows a high-frequency transformer 10 having a first and a second row 11, 12 of annular cores 13, 14, 15, 16 arranged next to one another. The annular cores 13 to 16 are preferably ferrite annular cores, but it is also possible to make use of other forms of core and of other magnetizable materials. It is not necessary for the cores 13 or 14 of the first row 11 precisely to face the cores 15, 16 of the second row 12. Likewise, the arrangement in two rows 11, 12 is a particular form, it being also possible to provide any other distribution of the cores. The cores 13 to 16 are held together by a sandwich construction composed of more than one elastic sheet. The construction begins with a bridge sheet 17, followed by a carrier or sheet 18, followed again by a bridge sheet or 19 and a carrier sheet 20, etc. The construction is finished with a bridge sheet 21. Openings 22 to 29 are provided in the carriers 18, 20 for accepting the cores 13 to 16. The size of the openings 22 to 29 is adjusted to the cross-section of the cores 13 to 16. The openings 22 to 29 end in cutouts 30 to 33 in the carriers 18, 20. The core holes of the cores 13 to 16 are pierced by strips in the carriers 18, 20 which form elastic tongues 34 to 37, which for the purpose of inserting the cores 13 to 16 in the openings 22 to 29 can be bent from the plane of the carriers 18, 20, and after being released spring back automatically into their position in the plane. In this way, after assembly the cores 13 to 16 are retained captively in the openings 22 to 29, there being no need for additional securing during transport to prevent falling out. The bridges 17, 19, 21 are constructed in such a way that they come to lie over the cutouts 30 to 33, and also over a part of the tongues 34 to 37 projecting from the core hole. It is their function to reclose the interruptions of the conductor tracks caused by and the cutouts 30 to 33.

Surface mounted devices (SMD) 38 to 41 are provided on the uppermost carrier 20 and on the uppermost bridge 21 in the region of the cores 13 to 16. These SMDs 38 to 41 are connected to conductor tracks of the coil windings and to other conductor tracks. For better visibility, not all conductor tracks are represented in FIG. 1. The spacial arrangement and the number of components 38 to 41 has been chosen arbitrarily.

All carriers and bridges, 17 to 21 are fixed at an end of the high-frequency transformer 10 by a centring pin 42. A further centering pin for fixing the sheets 17 to 21 is provided at a second end of the high-frequency transformer 10 not shown in FIG. 1. Accordingly, the entire sandwich construction is aligned by only two fixing pins 42.

FIG. 2 shows in detail a section of the sandwich construction of the high-frequency component 10 according to the invention and to FIG. 1, in the region of one of the cores 13 to 16. In FIGS. 1 and 2 the same parts are given the same reference numerals. Mounted area-wise on the underside 50 of the carrier 18 is a conductor track 51, which is led in the form of a rectangle around an opening 52 and a cutout 53 in the carrier 18, and which has a connecting piece 54. In the course of the conductor track 51 there is located on the underside 50 a bonding pad 55 for a surface mounted device, which is on the underside 50 of the carrier 18. Two conductor tracks 57, 58 are arranged area-wise in rectangular form around the opening 52 on the upperside 56 of the carrier 18. The conductor track 57 has a first and a second end 59, 60. At one end 60 a feedthrough 61 is provided to the underside 50 of the carrier 18. The conductor track 58 has a conductor track end 62 and a conductor track end 63. Owing to the conducting pieces, which are arranged on the bridges 17, 19 and bridge the cutouts 53, turns are produced by the conductor tracks 51, 57, 58. Provided on the bridge 17 is a conducting piece 64, which extends the conductor track 51 located on the underside 50 of the carrier 18 across the cut-out 53. The feedthrough 61 to the conductor track 57 on the upperside 56 of a carrier 18, which is bonded to the conducting piece 64 on the bridge 17, is provided so that, starting from the connecting piece 54 of the conductor track 51, a continuous can be produced.

A first and second conducting piece 66, 67 is arranged on the underside 65 of the bridge 19. The first conducting piece 66 connects the conductor track end 59 of the conductor 57 with the conductor track end 63 of the conductor 58 on the carrier 18. The second conducting piece 67 connects the conductor track end 62 of the conductor track 58 via a feedthrough 68 in the bridge 19 to conductor tracks, which are arranged on the second carrier 20.

Before the bridges 17, 19 are brought into contact with the carriers 18, a core 13 to 16, not shown in FIG. 2, is inserted in the opening 52 in the carrier 18, and also in a cutout 69. For this purpose, a removable tongue 72 delimited by the openings 52, 69 and by the cutouts 53, 70, 71 is lifted so far out of the plane of the carrier 18 that the annular core 13 to 16 can be inserted. After the removable tongue 72 has sprung back because of the elasticity of the sheet material of the carrier 18, the core is captively enclosed. Thereupon comes the mounting of the bridges 17 on the underside 50 or of the bridges 19 on the upperside 56 of the carrier 18, for example by means of thermocompression or by soldering.

For the sake of simplicity, no conductor tracks have been drawn in around the cutout 69. It is possible, here, to provide the same, or a similar, conductor track structure, as is arranged around the opening 52.

The sandwich construction is continued with the carrier 20. In this carrier 20, as well, openings 73, 74 and cutouts 75, 76, 77 delimit a removable tongue 78. The annular cores 13 to 16 are pushed over the tongue 78 which is lifted out of the plane.

On its upperside 79 the carrier 20 has a conductor track structure consisting of a first conductor track 80 and a second conductor track 81. The two conductor tracks 80, 81 are arranged rectangularly around the opening 73 and the cutout 75 in the carrier 20. The first conductor track 80 has a first conductor track end 82 and a second conductor track end 83. The second conductor track 81 has a first conductor track end 84 and a second conductor track end 85. Moreover, surface mounted devices (SMD) 86, 87 are provide the surface 79 of the carrier 20. A first SMD 86 is connected with one of its connecting pieces 88 to the first conductor track 80, which has a bonding pad 89 for this purpose. The other connecting piece 90 of the SMDs 86 is connected via a bonding pad 91 to a further connector track 92 arranged on the surface 79. The other surface mounted devices (SMD) 87 is connected with one of its connecting pieces 93 to the second conductor track 81, the second conductor track end 85 of which is constructed as bonding pad for this purpose. A continuation of the turns around the core 13 to 16 with the conductor tracks on the carrier 18, 20 is obtained by means of a feedthrough 94 through the carrier 20, which is provided at the first conductor track end 82 of the first conductor 80 and establishes a connection with the feed-through 68 in the bridge 19. The first conductor track 80 therefore represents a part of the first turn on the carrier 20. A continuous is obtained if the second conductor track end 83 of the first conductor 80 is connected to the first conductor track end 84 of the second conductor track end 81. Provided for this purpose is the bridge 21, which is no longer shown in FIG. 2. Interconnecting pieces are located on this bridge 21 in the same way as they are realized on the bridge 19 with the conducting pieces 66, 67 arranged thereon. If necessary, openings for surface mounted devices 86, 87 are to be provided in the bridge 21.

In order to increase further the number of turns, and therefore the inductance, of the coil it is possible to provide further bridges and carriers in alternate layers until the required number of turns is reached. In the illustrative embodiment shown according to FIG. 2, two conductor tracks 57, 58 or 80, 81 are arranged in each case parallel to one another in a plane on the carriers 18, 20. In principle, it is also possible to have more than one conductor tracks lying next to one another, but it is then necessary to reckon with a small increase in the leakage inductance of the coil, because the conductor tracks lying further from the openings 52, 69, or 73, 74 generate a magnetic leakage field in the outer region of the cores 13 to 16.

FIG. 3 shows a circuit diagram of a linear network, here an all-pass filter as an example, for the realization of which the high-frequency component according to the invention is particularly suited. At its output 101, the all-pass filter delays an input signal occurring at its input 100 by an amount which depends on the frequency. In the ideal case, no attenuation of the signal occurs. The frequency-dependant phase shift between input and output signal is equivalent to a frequency-dependant group delay, so that the all-pass filter can be used for delay distortion correction of signals.

The first input terminal 102 is connected to a capacitor 103, which leads to the first output terminal 104, and with the first part 105 of the primary 105 of a repeating coil 106. The second part of the primary 107 is connected to a first part of the secondary 108, and also, via a series circuit consisting of a capacitor 109 and a coil 110, to the second input terminal 111 and the second output terminal 112. The first part of the secondary 108 is connected via the second part of the secondary 113 to the first output terminal 104. The repeating coil 106 contains a core 114, which is, for example, one of the cores 13 to 16. The all-pass filter shown in FIG. 3 can be realized with advantage using the sandwich construction shown in FIG. 2. The first part of the primary 105 is realized, for example, by the conductor tracks 51, 57, 58 on the carrier 18. The second part of the primary 107 is then arranged around the opening 69 and the cutout 70. The first part of the secondary 108 is realized, for example, by the conductor tracks 80, 81 on the carrier 20, the second part of the secondary 113 by conductor tracks, which are arranged around the opening 74 and the cutout 77. This spatial distribution of the primary and secondary of the repeating coil 108 means that the first part of the primary 105 is assigned spacially to the second part of the secondary 113, the second part of the primary 107 to the first part of the secondary 108. Owing to the mutual cross-over of the primary and secondary, there is produced a symmetrical repeating coil circuit having identical winding capacitances and a low leakage inductance, so that an almost ideal repeating coil can be realized in this way. With the all-pass filter section according to FIG. 3, the winding capacitance of primary to secondary can be assigned to the capacitor 103. In this way, the real all-pass filter section has only the unavoidable ohmic losses, and hence the desired minimum transmission loss and the previously calculated phase shift or group delay as a function of the frequency. The two capacitors 103, 109 are, for example, the surface mounted devices (SMD) 86, 87 shown in FIG. 2. In FIG. 2, the points of connection to the bonding pads 85, 89 are drawn in only by way of example, and do not correspond to the actual terminals of the capacitors 103, 109 in FIG. 3. The coil 110 contains a core 115, which is one of the cores 13 to 16.

The conductor track structures can be modified in order to achieve particular electrical properties. For example, with increase in the number of turns it is also possible to increase the conductor track width, so that the ohmic losses occasioned by the extended routing is not further increased. In definite regions, especially where SMDs 86, 87 are provided, the geometrical distribution of the conductor tracks in the plane is to be adjusted to the dimensions of the SMDs 86, 87. For this purpose, it is possible, for example, to stipulate in advance the sum of the insulation spacings between the turns and the widths of the conductor tracks.

A modification of the arrangement according to FIG. 2 is given in that the cutouts 53, 70 or 75, 77 are no longer arranged parallel to one another, but extend in such a way that the widths of the sections of the tongues 72, 78 delimited by the cutouts 53, 70 or 75, 77 decrease in the direction of the cutouts 71 or 77. This shaping of the tongues 72, 78 facilitates the insertion of the cores 13 to 16, because the start of the tongues is much narrower than the diameter of the core holes.

The proposed high-frequency transformer is suitable for holding not only single-aperture, but also multi-aperture cores. In this connection, each core hole is pierced by an elastic tongue, which can have a form which is the same as or similar to the tongues 34 to 37, 72, 78 shown in FIGS. 1 and 2. Accordingly, it is also possible with the high-frequency frequency component according to the invention to realize linear networks which contain complicated repeating coils.

We claim:

1. A high-frequency transformer comprising at least one annular core of a magnetizable material; at least two superposed elastic carrier sheets each formed with a pair of openings adjusted for receiving corresponding cross-sectional parts of the annular core, each of the pairs of openings delimiting a strip of the corresponding carrier sheet, the strip passing through the central hole of the annular core and extending into a cutout in the corresponding carrier sheet, in such a way that it forms an elastic tongue bendable for inserting the annular core into the openings; conductor tracks mounted on opposite sides of each of the carrier sheets around at least one of the openings whereby the portions of the conductor tracks on the respective sides are separated one from the other by the cutout; an intermediate bridge sheet sandwiched between the two carrier sheets and being provided on opposite sides thereof with conductor track sections for connecting the end portions of the facing conductor tracks; two outer bridge sheets connected to the free outer sides of the carrier sheets and each being provided on one side thereof with conductor track sections for connecting the end portions of the facing conductor tracks on the free outer sides to complete primary and secondary coil turns around the annular core.

2. A transformer according to claim 1 characterized in that at least one feedthrough (61, 94) is provided in the carrier sheets (18, 20).

3. A transformer according to claim 1 characterized in that at least one feedthrough (68) is provided in the bridge sheets (19).

4. A transformer according to claim 1, characterized in that the carrier sheets support a first and at least a second row (11, 12) of annular said cores (13, 14 or 15, 16) arranged next to one another.

5. A transformer according to claim 4, characterized in that the bendable tongues (34, 35) of the first row (11) and the bendable tongues (36, 37) of the second row (12) are aligned against one another in the carrier sheets (18, 20).

6. A transformer according to claim 1, characterized in that the bendable tongues (34 to 37, 72 78) reduce in width in the direction away from said openings.

7. A transformer according to claim 1, characterized in that the carrier sheets (18, 20) and the bridges (17, 19, 21) are located by at least two alignment pins (42).

8. A transformer according to claim 1, characterized in that there are provided on the carrier sheets (18, 20) bonding pads (85, 89) for surface mounted devices 938 to 41, 86, 87).

9. A transform according to claim 1, characterized in that the sum of insulation spacings between the conductor tracks (57, 58 or 80, 81, 92) and the widths of the conductor tracks (57, 58 or 80, 81) is adjusted to dimensions of surface mounted devices (38 to 41, 86, 87).

10. High-frequency component according to claim 1 characterized in that a first part of the primary (105) of a repeating coil (106), and a first part of the secondary (108) of the repeating coil (106) is arranged around one of the openings (52, 73) in the carriers sheets (18, 20), and a second part of the primary (107) as well as a second part of the secondary (113) of the repeating coil (106) is arranged around the other opening (69, 74) in the carriers sheets (18, 20).

* * * * *